(12) United States Patent
Ye et al.

(10) Patent No.: US 10,060,600 B1
(45) Date of Patent: *Aug. 28, 2018

(54) LIGHT EMITTING DEVICE

(71) Applicant: HARVATEK CORPORATION, Hsinchu (TW)

(72) Inventors: Zhi-Ting Ye, Hsinchu (TW); Shyi-Ming Pan, Hsinchu (TW)

(73) Assignee: HARVATEK CORPORATION, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/473,626

(22) Filed: Mar. 30, 2017

(51) Int. Cl.
| | |
|---|---|
| *H01L 33/00* | (2010.01) |
| *H01L 33/60* | (2010.01) |
| *H01L 33/48* | (2010.01) |
| *H01L 33/54* | (2010.01) |
| *H01L 33/50* | (2010.01) |
| *H01L 33/44* | (2010.01) |
| *F21V 9/08* | (2018.01) |
| *F21V 7/06* | (2006.01) |
| *F21V 7/22* | (2018.01) |
| *F21V 8/00* | (2006.01) |
| *F21Y 115/10* | (2016.01) |

(52) U.S. Cl.
CPC .............. *F21V 9/08* (2013.01); *F21V 7/06* (2013.01); *F21V 7/22* (2013.01); *G02B 6/0045* (2013.01); *G02B 6/0076* (2013.01); *F21Y 2115/10* (2016.08)

(58) Field of Classification Search
None
See application file for complete search history.

(56) References Cited

U.S. PATENT DOCUMENTS

| | | | | |
|---|---|---|---|---|
| 8,079,737 | B2* | 12/2011 | Wang | F21V 7/0008 362/296.1 |
| 9,799,810 | B1* | 10/2017 | Ye | H01L 33/60 |
| 2014/0307434 | A1* | 10/2014 | Ye | F21K 9/50 362/235 |
| 2016/0320004 | A1* | 11/2016 | Tudorica | F21V 29/76 |

* cited by examiner

*Primary Examiner* — Ashok Patel
(74) *Attorney, Agent, or Firm* — Chieh-Mei Wang (57) ABSTRACT

A light emitting device includes a light emitting chip, a reflecting cup arranged on a side of the light emitting chip, and a package encapsulating the light emitting chip and the reflecting cup. The light emitting chip includes a first light emitting surface and a second light emitting surface coupled to the first light emitting surface. The reflecting cup has an inner surface facing the second light emitting surface of the light emitting chip. The reflecting cup arranges around a periphery of the second light emitting surface. The inner surface of the reflecting cup is a multifocal paraboloid. The multifocal paraboloid includes multistage paraboloids. The corresponding focus points of the multistage paraboloids are symmetrically distributed on the first light emitting surface of the light emitting chip.

20 Claims, 10 Drawing Sheets

LIGHT EMITTING DEVICE

FIELD

The subject matter herein generally relates to a light emitting device.

BACKGROUND OF THE INVENTION

Light emitting diode products can be seen everywhere, such as in traffic signals, automobile lamps, street lamps, lights or flashlights. These light emitting diode products always need to keep a narrow light exiting angle, so that the light emitted by the light emitting diode is more concentrated or focused. The light exiting angle of conventional light emitting diode is about 120 degrees, which is quite large. At present, the light emitting diode is usually combined with a reflecting structure to reduce the light exiting angle. However, an intervention of the reflecting structure would enlarge a total volume of light emitting diode product, thus it is not convenient for a user to carry. Moreover, it is difficult to align the light emitting diode with the reflecting structure during assembly.

At the present, the reflecting structure of the light emitting diode product is improved to reduce the volume of the light emitting diode product and to solve the alignment problem. For example, the reflecting structure arranges around a periphery of the light emitting diode, and the reflecting structure is configured as a paraboloid. However, since the light emitting diode is a plane light source or a body light source, rather than a desired point light source, the paraboloid with a single focal point still cannot achieve a well narrowed light emitting angle. As such, its condenser capacity is still limited.

The following detailed descriptions of exemplary embodiments are to be considered in combination with the accompanying figures. As will be realized, the subject matter disclosed and claimed is capable of modifications in various respects, all without departing from the scope of the claims. Accordingly, the drawings and the description are to be regarded as illustrative in nature, and not as restrictive in relation to the full scope of the subject matter as set forth in the claims.

SUMMARY

The present disclosure provides a light emitting device.

A light emitting device includes a light emitting chip, a reflecting cup arranged on a side of the light emitting chip, and a package for encapsulating the light emitting chip and the reflecting cup. The light emitting chip includes a first light emitting surface and a second light emitting surface coupled to the first light emitting surface. The reflecting cup has an inner surface facing the second light emitting surface of the light emitting chip. The reflecting cup arranges around a periphery of the second light emitting surface of the light emitting chip. The inner surface of the reflecting cup is a multifocal paraboloid. The multifocal paraboloid includes multistage paraboloids. The corresponding focus points of the multistage paraboloids are symmetrically distributed on the first light emitting surface of the light emitting chip.

In an alternative exemplary embodiment, the light emitting device further includes a wavelength conversion layer arranged over the light emitting chip.

In an alternative exemplary embodiment, the wavelength conversion layer arranges on an end portion of the reflecting cup opposite to the light emitting chip.

In an alternative exemplary embodiment, the wavelength conversion layer covers the first light emitting surface and the second light emitting surface of the light emitting chip.

In an alternative exemplary embodiment, the reflecting cup is made of a specular reflective material.

In an alternative exemplary embodiment, the specular reflective material is a metallic material. The metallic material comprises gold, silver, aluminum, chromium, copper, tin, or nickel.

In an alternative exemplary embodiment, each paraboloid has at least one focal length, and wherein the corresponding focal lengths of the multistage paraboloids increase gradually in a direction away from the light emitting chip.

In an alternative exemplary embodiment, the first light emitting surface is an axisymmetric pattern.

In an alternative exemplary embodiment, the first light emitting surface includes a symmetry axis, and each paraboloid has at least one focus. The corresponding focus points of the multistage paraboloids are symmetrical around the central axis of the light emitting chip and spaced apart from each other around the symmetry axis of the first light emitting surface.

In an alternative exemplary embodiment, the adjacent two paraboloids are symmetrical.

In an alternative exemplary embodiment, the multistage paraboloids includes at least three-stage parabolas. The at least three-stage paraboloids includes a first paraboloid, a second paraboloid and a third paraboloid. The first paraboloid, the second paraboloid and the third paraboloid arrange away from a direction of the light emitting chip in a smooth transition.

In an alternative exemplary embodiment, a focus of the first paraboloid is located at a position adjacent to a bottom portion of the light emitting chip. A focus of the third paraboloid is located at a position adjacent to a top portion of the wavelength conversion layer. A focal point of the second paraboloid is located between the focal point of the first paraboloid and the focal point of the third paraboloid.

In an alternative exemplary embodiment, the inner surface of the reflecting cup arranges an inclined surface coupled to the multistage paraboloids adjacent to the light emitting chip.

In an alternative exemplary embodiment, the inclined surface of the reflecting cup and the second light emitting surface form an angle. The angle is substantially in a range of 30 degrees to 45 degrees.

In an alternative exemplary embodiment, the light emitting surface is substantially a planar, an elliptical or semi-circular surface.

In an alternative exemplary embodiment, the package comprises a light exiting surface facing the first light emitting surface.

In an alternative exemplary embodiment, a ratio of a luminous intensity of the first light emitting surface of the light emitting chip to the luminous intensity of the second light emitting surface of the light emitting chip is substantially in the range of 1:1.

In an alternative exemplary embodiment, the package includes a first light guiding member and a second light guiding member formed on the first light guiding member. The first light guiding member encapsulates the light emitting chip and the reflecting cup.

In an alternative exemplary embodiment, the first light guiding member comprises a first light exiting surface, and the first light exiting surface is a planar surface. The second guiding member includes a second light exiting surface, and the second light exiting surface is an elliptical or semi-circular surface.

In an alternative exemplary embodiment, a height from an apex of the first light exiting surface to the second light exiting surface represents a, and a width of the first light exiting surface represents b, and wherein a value of b/a is in a range of $1.4 \leq b/a \leq 2$.

According to the light emitting device of the present disclosure, the light emitting chip defines a first light emitting surface and a second light emitting surface. The light emitted by light emitting chip passes through the second light emitting surface, thus the length required for the reflecting cup can be reduced. In addition, the reflecting cup arranges multistage paraboloids, and the corresponding focus points of the multistage paraboloids are symmetrically distributed on the first light emitting surface of the light emitting chip. Since the other part of the light pass through the first light emitting chip, and the reflected by the inner surface of the reflecting cup, so the light emitted by the light-emitting device can be more concentrated.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" means essentially conforming to the particular dimension, shape or other feature that the term modifies, such that the component need not be exact. For example, "substantially cylindrical" means that the object resembles a cylinder, but may have one or more deviations from a true cylinder. The term "comprising" or "containing" when utilized, means "including, but not necessarily limited to"; it specifically indicates open-ended inclusion or membership in the so-described combination, group, series and the like. The term "directing" is intended to mean providing a path or passage for something from one position into a destination position. The terms "first", "second" and other terms in the present disclosure are only used as textual symbols as the circumstances may require, but such ordination is not limited to using only these terms. It should be further noted that these terms can be used interchangeably.

The present disclosure is described in relation to a light emitting device.

Figure 1:
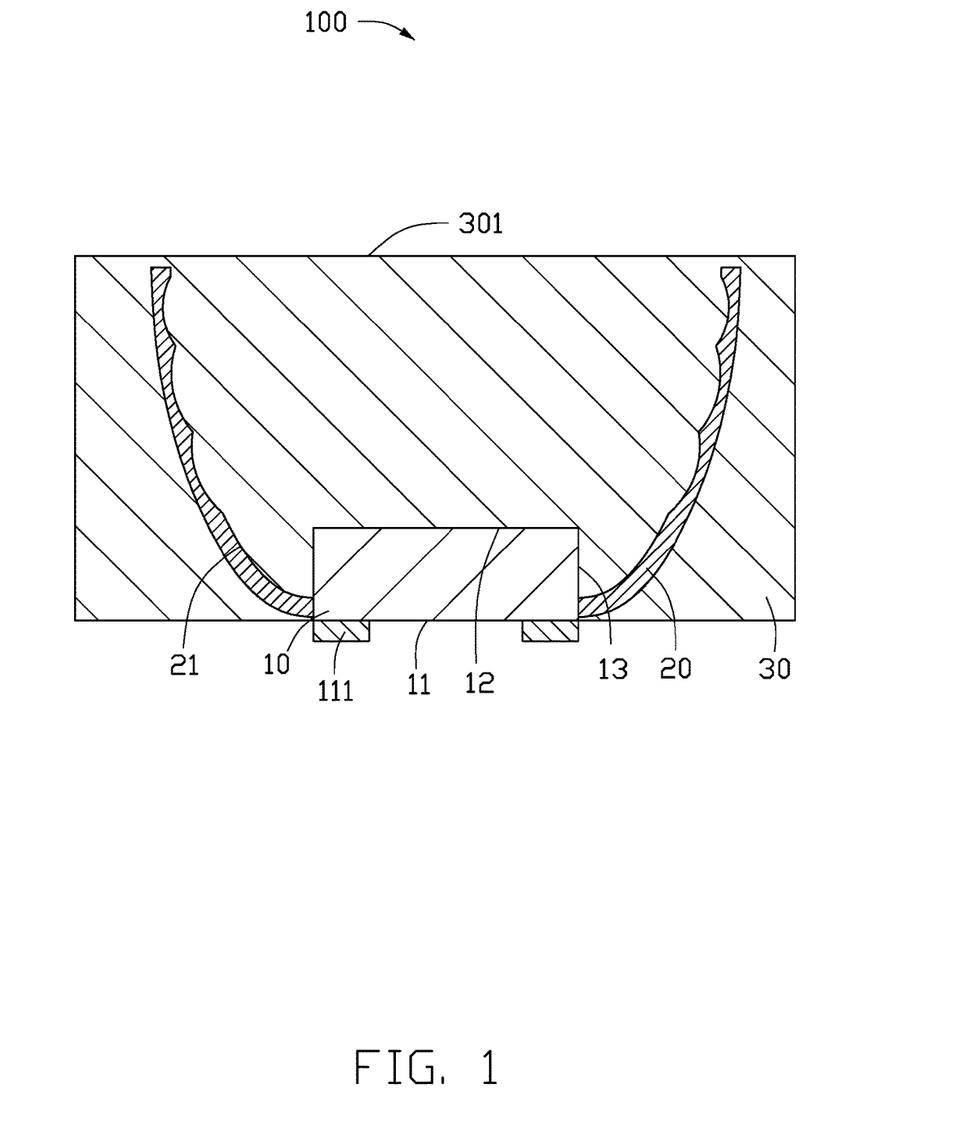
FIG. 1 is a schematic view of a first exemplary embodiment of a light emitting device according to the present disclosure, wherein the light emitting device includes a light emitting chip and a reflecting cup, and the light emitting chip includes a first light emitting surface.

The present disclosure provides a light emitting device 100. FIG. 1 shows a schematic view of a first exemplary embodiment of the light emitting device 100. The light emitting device 100 includes a light emitting chip 10, a reflecting cup 20, and a package 30. The reflecting cup 20 is provided around a periphery of the light emitting chip 10. The package 30 encapsulates the light emitting chip 10 and the reflecting cup 20.

The light emitting chip 10 may be a horizontal type light emitting diode chip, a vertical type light emitting diode chip, a flip chip type light emitting diode chip, or any combination thereof. The type of light emitting chip 10 may be changed as desired by the user.

In the present embodiment, the light emitting chip 10 is a flip-chip light emitting chip.

The light emitting chip 10 has a bottom surface 11, a first light emitting surface 12 and a second light emitting surface 13. The first light emitting surface 12 faces toward the bottom surface 11. The second light emitting surface 13 is coupled to the bottom surface 11 and the first light emitting surface 12.

Figure 2:
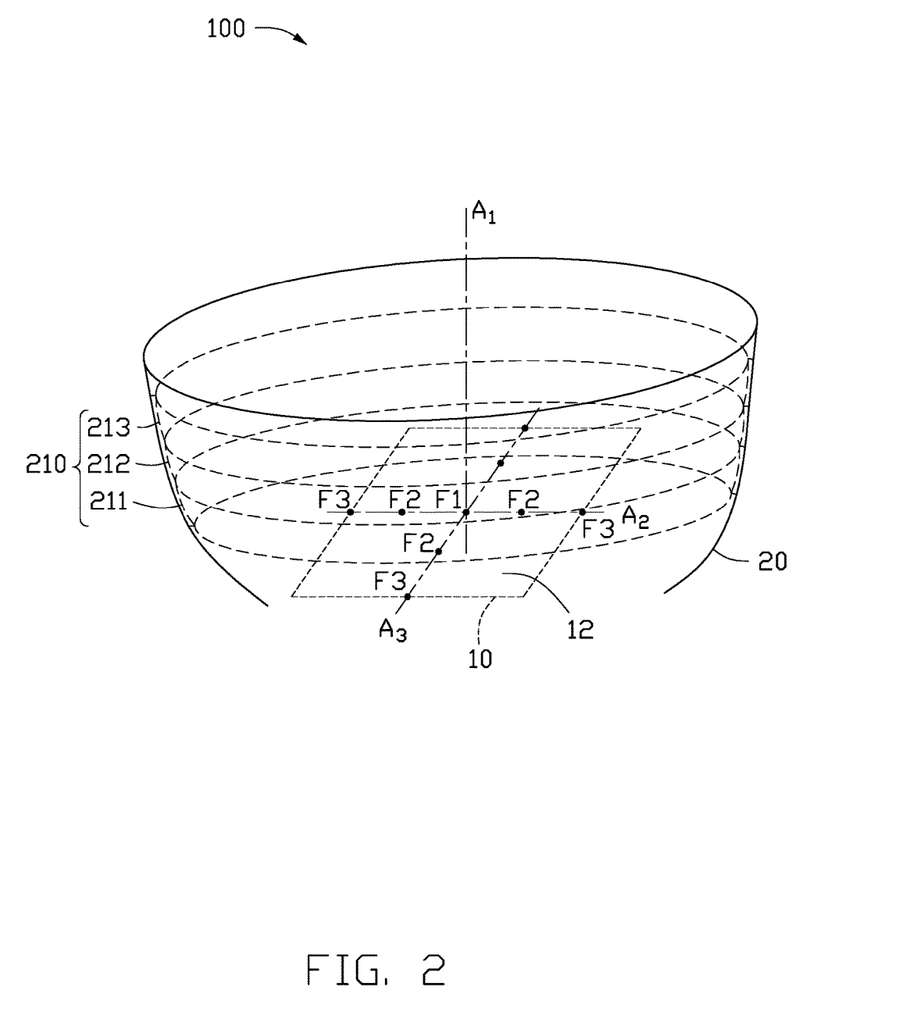
FIG. 2 is a schematic view of the first light emitting surface and the reflecting cup of the first exemplary embodiment.

As shown in FIG. 1 and FIG. 2, the first light emitting surface 12 of the light emitting chip 10 is axisymmetric, and the light emitting chip 10 has a central axis A1. Thus, light emitted from the light emitting chip 10 can be transmitted uniformly to an exterior of the light emitting device 100.

It can be understood that, for the light emitting chip 10, a ratio of a first light intensity of the first light emitting surface 12 to a second light intensity of the second light emitting surface 13 is 1:1. Thus, light emitted from the light emitting chip 10 can transmit uniformly and collectively to the exterior of the light emitting device 100.

Two connection blocks 111 are protruded vertically outward from the bottom surface 11 of the light emitting chip 10. The two connection blocks 111 are located on two opposite sides at the bottom surface 11. The light emitting chip 10 is coupled to an external power source (not shown) by the two connection blocks 111.

Referring to FIG. 1 and FIG. 2, in the present exemplary embodiment, the first light emitting surface 12 of the light emitting chip 10 has a first symmetry axis A2 and a second symmetry axis A3. The first symmetry axis A2 is perpendicular to the second symmetry axis A3. The central axis A1 is perpendicular to the first symmetry axis A2, and the central axis A1 is also perpendicular to the second symmetry axis A3. An intersection point of the central axis A1, the first symmetry axis A2, and the second symmetry axis A3 is a symmetrical center of the light emitting chip 10.

The reflecting cup 20 is configured as a bowl-shaped body having a multifocal paraboloid. A width of a cross-section of the reflecting cup 20 increases gradually in a direction away from the light emitting chip 10, in order to improve the light-emitting efficiency of the light emitting device 100.

The reflecting cup 20 has an inner surface 21 that faces toward the second light emitting surface 13 of the light emitting chip 10. The inner surface 21 of the reflecting cup 20 is made of a specular reflective material. The specular reflective material may be a metallic material. The metallic material may include, but not limited to, gold, silver, aluminum, chromium, copper, tin, and nickel.

The inner surface 21 of the reflecting cup 20 has multistage paraboloids 210 at an end of the reflecting cup 20 opposite to the light emitting chip 10. The multistage paraboloids 210 have a plurality of focal points. The plurality of focal points of the multistage paraboloids 210 are symmetrically distributed around the central axis A1 and spaced apart from each other. The plurality of focal points does not overlap each other. The plurality of focal points of the multistage paraboloids 210 is located on the first light emitting surface 12 of the light emitting chip 10.

Preferably, the plurality of focal points of the multistage paraboloids 210 is distributed symmetrically on the first light emitting surface 12 of the light emitting chip 10 around the central axis A1. Thus, light emitted from the light emitting device 100 can transmit uniformly toward the exterior.

More preferably, the plurality of focal points of the multistage paraboloids 210 is distributed symmetrically on a symmetrical axis of the first light emitting surface 12 of the light emitting chip 10 around the central axis A1.

In the present embodiment, the plurality of focal points of the multistage paraboloids 210 is distributed symmetrically on the first symmetry axis A2 and the second symmetry axis A3 of the first light emitting surface 12 of the light emitting chip 10 around the central axis A1.

It can be understood that the focal points of the multistage paraboloids 210 may be configured as light emitting points of the light emitting chip 10. Thus, light emitted by the light emitting chip 10 can achieve a better focusing effect.

It can be understood that a focal length of each of the multistage paraboloids 210 may increase gradually in a direction away from the light emitting chip 10, in order to achieve a better focusing effect.

Figure 3:
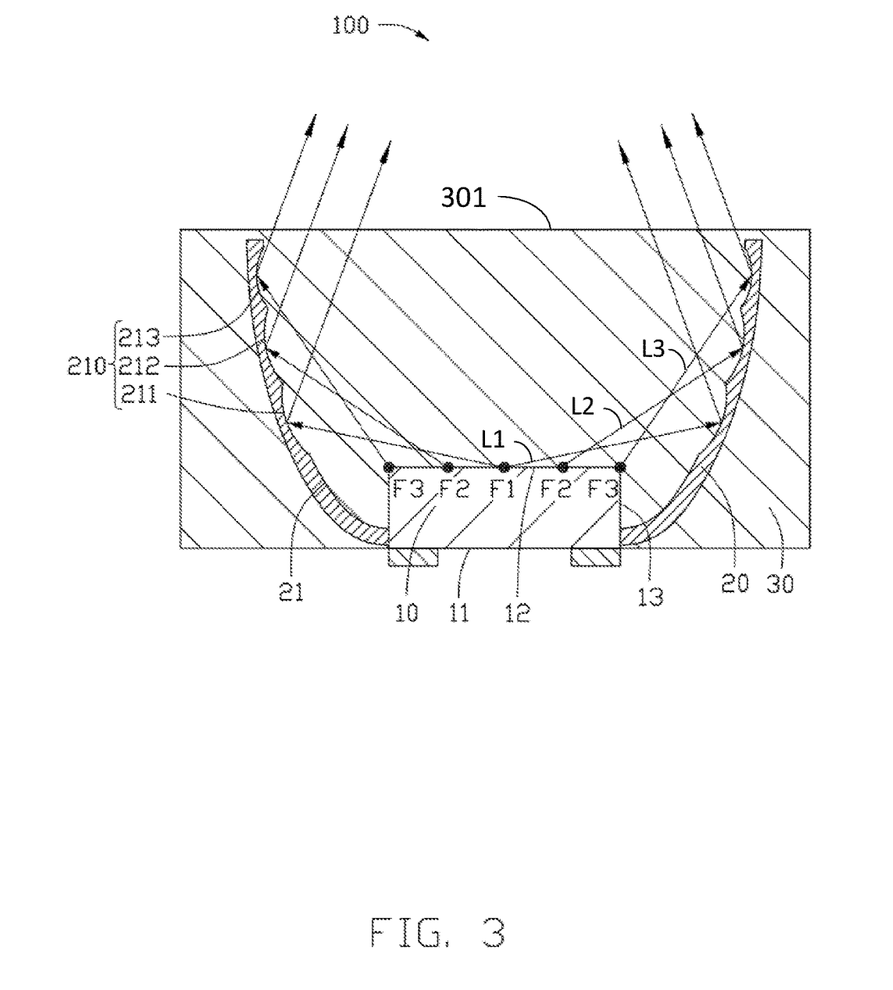
FIG. 3 is a schematic view of a light path of the light emitting device of the first exemplary embodiment.

FIG. 3 shows a cross-sectional view of the light emitting device 100. A cross section of the light emitting device 100 includes a first side and a second side opposite to the first side. The corresponding focus points of the multistage paraboloids 210 in the first side or the second side of the light emitting device 100 form a straight line, respectively. The focal points of the multistage paraboloids 210 are symmetrically distributed around the central axis A1 of the light emitting chip 10. Each of the multistage paraboloids 210 has two symmetrical focal points and two symmetrical focal lengths at a cross section of the light emitting chip 10, where the cross section is a section formed by the central axis A1 and the first symmetry axis A2 or a section formed by the central axis A1 and the second symmetry axis A3. The corresponding focus points of the multistage paraboloids 210 are located on the first light emitting surface 12 of the light emitting chip 10, and symmetrically distributed around the central axis A1 of the light emitting chip 10. The cross section of the multistage paraboloids 210 has a first side and a second side. The corresponding focus points of the multistage paraboloids 210 in the first side or the second side form a straight line, respectively. The corresponding focus lengths of the multistage paraboloids 210 are different from each other in a direction away from the light emitting chip 10.

It can be understood that two adjacent paraboloids of the multistage paraboloids 210 are symmetrically distributed. Curvature of each paraboloid may be substantially consistent. An adjacent pair of the paraboloids of the multistage paraboloids 210 has a smoothly transition. The multistage paraboloids 210 are integrally formed.

Preferably, the multistage paraboloids 210 have at least three stages. The multistage paraboloids 210 include a first paraboloid 211, a second paraboloid 212, and a third paraboloid 213. The first paraboloid 211, the second paraboloid 212, and the third paraboloid 213 are smoothly transit between each other in a direction away from the light emitting chip 10 in sequence. The first paraboloid 211, the second paraboloid 212, and the third paraboloid 213 are symmetrical distribution taken from the central axis A1 of the light emitting chip 10.

FIG. 3 shows a cross-sectional view of the light emitting device 100. The cross-sectional view is formed by the central axis A1 and the first symmetry axis A2 (or the second symmetry axis A3). The first paraboloid 211 has a first focus point F1 and two symmetrical first focal lengths L1, the second paraboloid 212 has two symmetrical second focus points F2 and two symmetrical second focal lengths L2, and the third paraboloid 213 has two symmetrical second focus points F3 and two symmetrical second focal lengths L3, wherein $L3>L2>L1$. All of the focus points F1, F2 and F3 lie on the first symmetry axis A2 or the second symmetry axis A3 of the first light emitting surface 12 of the light emitting chip 10. In the case that the focus points F1, F2 and F3 lie on the first symmetry axis A2, the focus points F1, F2 and F3 extend in a line that is perpendicular to the second symmetry axis A3.

In the embodiment, the first focus point F1 of first paraboloid 211 may be located at the symcenter of the light emitting chip 10. The third focus points F3 of the third paraboloid 213 may be located at two opposite ends of the first light emitting surface 12 of the light emitting chip 10. The second focus F2 of the second paraboloid 212 may be located at the first light emitting surface 12 of the light emitting chip 10, and the second focus F2 is located at an intermediate position between a line of the first focus F1 and the second focus F2.

A shape of the multistage paraboloids 210 can be calculated according to a different position of the light emitting chip 10 and a different requirement of the light. The corresponding focus points of the multistage paraboloids 210 are symmetric around the central axis A1. The light emitting chip 10 is located at a symmetrical center of the corresponding focus points, to allow the corresponding focus points of the multistage paraboloids 210 to be symmetrically distributed on the first light emitting surface 12 of the light emitting chip 10.

A suitable size and shape of the light emitting chip 10 can be selected according to a shape of the reflecting cup 20, to facilitate the uniform illumination and the full utilization of the light emitted by the light emitting device 100. In addition, the shape of the multistage paraboloids 210 can be selected according to the shape of the light emitting chip 10, and a user can adjust a length and an opening of the multistage paraboloids 210, to achieve a good lighting effect of the light emitted by the lighting emitting device 100.

The package 30 is covered the light emitting chip 10 and the reflective cup 20. The package 30 may be configured as a light guiding member. In the embodiment, the package 30 is filled on two sides of the reflecting cup 20. The side light emitting chip 10 and the reflecting cup 20 are sealed by the package 30 to form a specific shape, such as a cuboid, a cube.

The package 30 is configured to fix the light emitting chip 10 and the reflective cup 20, and adjust a relative position between the light emitting chip 10 and the reflective cup 20. In other words, the reflecting cup 20 is located at a predetermined position via the package 30, to allow the corresponding focus points of the multistage paraboloids 210 to fall on the first light emitting surface 12 of the light emitting chip 10. The package 30 is further configured to guide the light emitted by the light emitting chip 10 to a preset position, to adjust the irradiation range of the light emitted by the light emitting chip 10.

A material of the package 30 may include, but is not limited to, silicone. It should be noted that the material of the package 30 may include other light guiding materials that can guide the light emitted by the light emitting chip 10 and have high transparency.

A top portion of the package 30 arranges a light exiting surface 301 facing the first light emitting surface 12 of the light emitting chip 10.

In order to improve the light-emitting efficiency of the light-emitting device 100, the light exiting surface 301 may be substantially, but is not limited to, a planar, an elliptical or semi-circular surface.

The light exiting surface 301 may preferably be the an elliptical or semi-circular surface, to allow the light emitted by the light emitting chip 10 and fails to irradiate toward the reflecting cup 20 to be refracted, so the light emitted by the light-emitting device 100 can be more concentrated.

The reflective cup 20 includes a top end opposite to the light emitting chip 10 and a bottom end adjacent to the light emitting chip 10. A bottom portion of the light exiting surface 301 of the package 30 may be substantially flush with or higher than a top end of the reflective cup 20. Therefore, the light emitted by the light emitting chip 10 may accurately reach the preset position of the multistage paraboloids 210 of the reflecting cup 20 through the package 30, and the light emitted by the light emitting device 100 is more concentrated. The light emitting chip 10 and the reflecting cup 20 are encapsulated by the package 30 to achieve an accurate alignment.

In the embodiment, the light exiting surface 301 is the planar surface, and the light exiting surface 301 is flush with the top end of the reflecting cup 20, to facilitate a thin type of the light emitting device 100.

FIG. 3 shows a light path of the light emitted by the light emitting device 100. The light emitting chip 10 emits light. One part of the light emitted by the light emitting chip 10 passes through the first light emitting surface 12 of the light emitting chip 10, and irradiates toward the inner surface of the reflecting cup 20. The light reflected by the multistage paraboloids 210 of the reflecting cup 20 passes through the light exiting surface 301 of the package 30. The light emitting device 100 can reduce the light exiting angle of the light emitted by the light emitting chip 10, and the light emitted by the light emitting chip 10 can intensely irradiates toward the exterior of the light emitting device 100. The other part of the light emitted by the light emitting chip 10 passes through the second light emitting surface 13 of the light emitting chip 10, and irradiates the light exiting surface 301 of the package 30.

Figure 4:
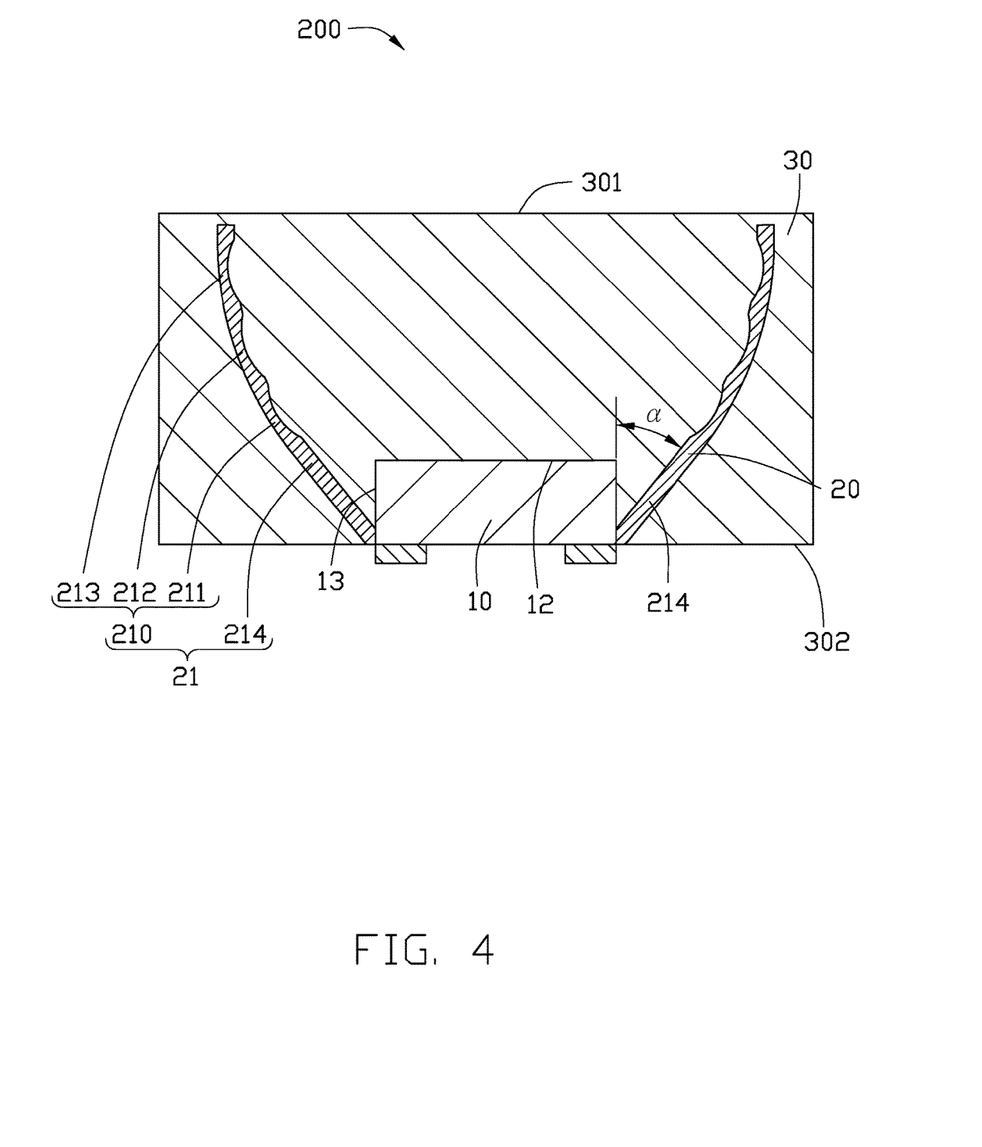
FIG. 4 is a schematic view of a secondary exemplary embodiment of the light emitting device according to the present disclosure.

As shown in FIG. 4, in a second embodiment, the light emitting device 200 includes a light emitting chip 10, a reflecting cup 20 and a package 30. The light emitting chip 10, the reflecting cup 20 and the package 30 are consistent features among the structures of the first exemplary embodiment. The difference in the second exemplary embodiment is that the inner surface 21 of the reflecting cup 20 arranges an inclined surface 214 coupled to an end portion of the multistage paraboloids 210 adjacent to the light emitting chip 10.

The inclined surface 214 of the reflecting cup 20 and the second light emitting surface 13 of the light emitting chip 10 for an angle α. The angle α is substantially in a range of 30 degrees to 45 degrees. Therefore, the light emitted by the light emitting chip 10 irradiates toward the inclined surface 214. The light reflected by the inclined surface 214 is refracted by the light exiting surface 301 of the package 30, to facilitate the light more concentration of the emitted light. In addition, the thickness of the package 30 can be shorten.

Figure 5:
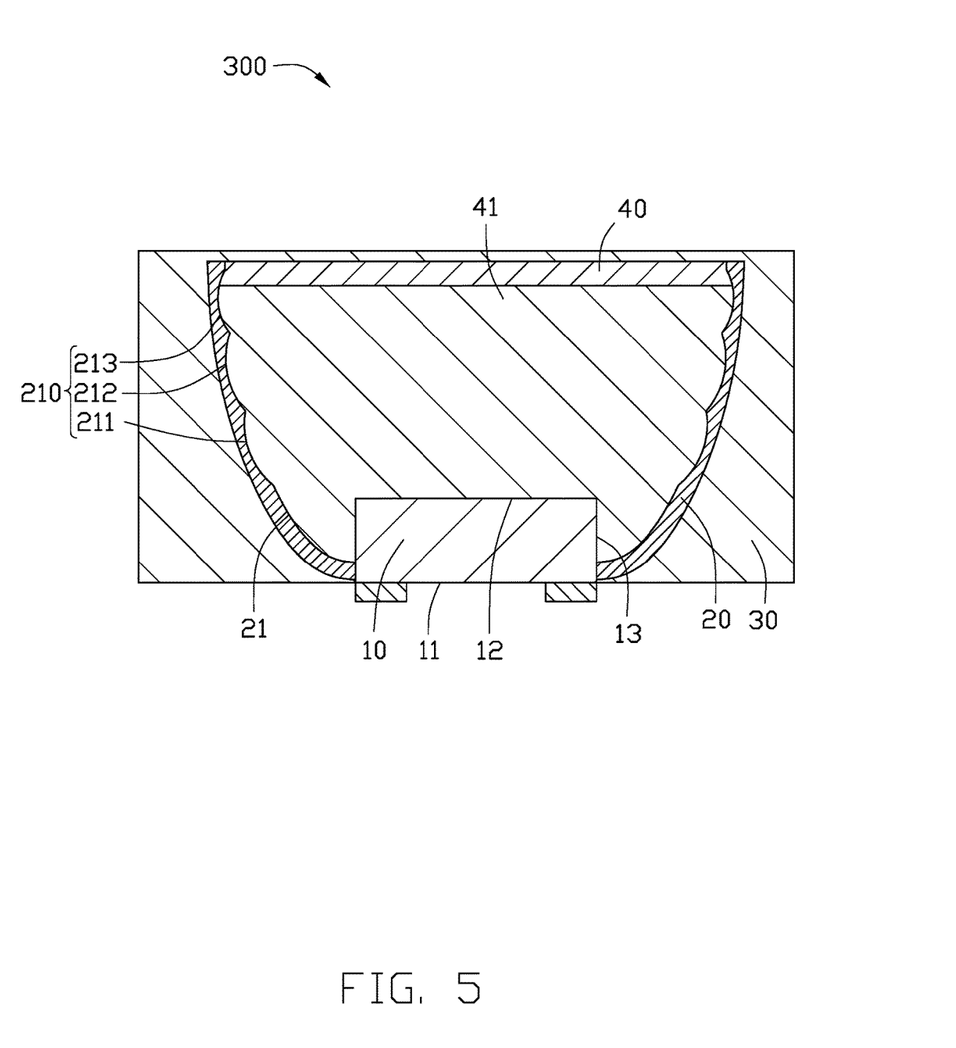
FIG. 5 is a schematic view of a third exemplary embodiment of the light emitting device according to the present disclosure.

As shown in FIG. 5, in a third embodiment, the light emitting device 300 includes a light emitting chip 10, a reflecting cup 20 and a package 30. The light emitting chip 10, the reflecting cup 20 and the package 30 are consistent features among the structures of the first exemplary embodiment. The difference in the third exemplary embodiment is that the light emitting device 300 further includes a wavelength conversion layer 40 arranged on an end portion of the multistage paraboloids 210 opposite to the light emitting chip 10.

The wavelength conversion layer 40 is coupled to the reflecting cup 20 to form a seal end 41, so the light emitted by the light chip 10 can change to a specific wavelength.

The wavelength conversion layer 40 is for converting the light emitted from the light emitting wafer 10 into a specific wavelength. It will be appreciated that the wavelength conversion layer 40 may adjust the light wavelength in accordance with a desire of a user.

It is to be understood that, in another embodiment, the reflective cup 20 may apply to the inclined surface 214 according to the second embodiment.

Figure 6:
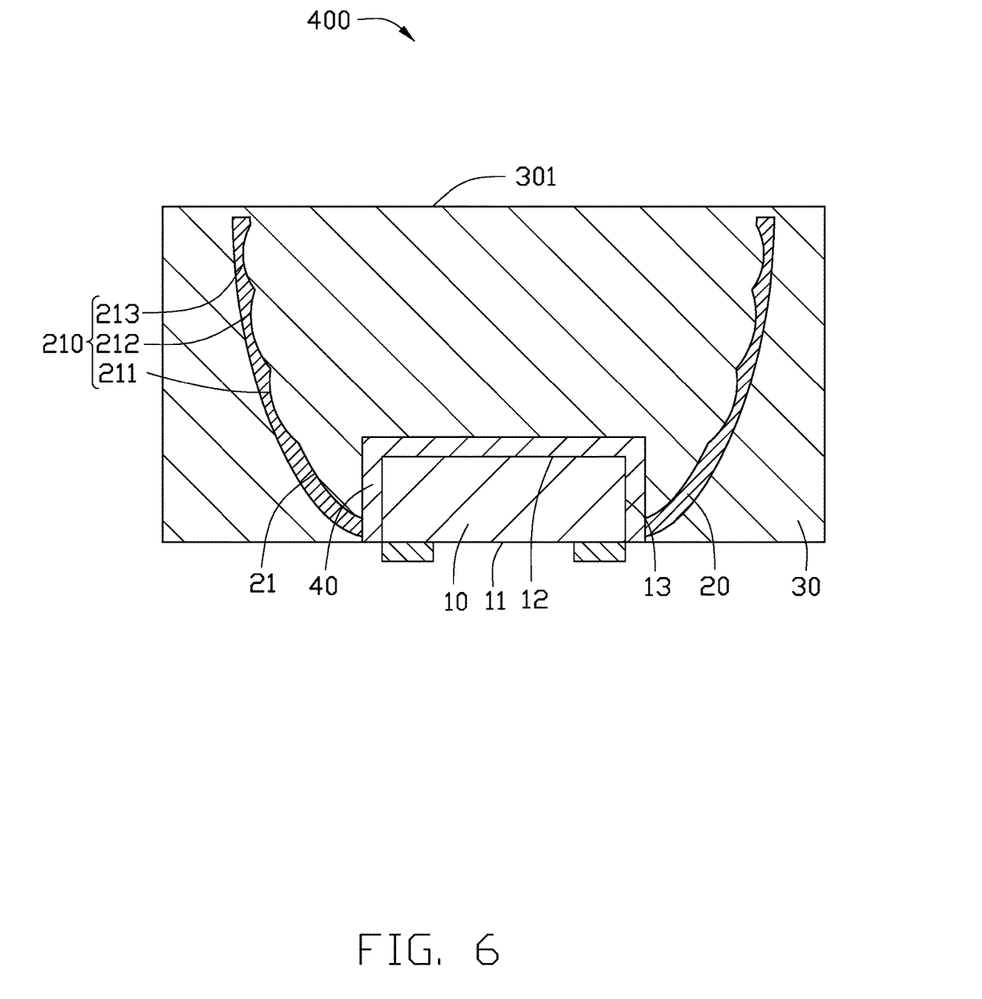
FIG. 6 is a schematic view of a fourth exemplary embodiment of the light emitting device according to the present disclosure.

As shown in FIG. 6, in a fourth embodiment, the light emitting device 400 includes a light emitting chip 10, a reflecting cup 20 and a package 30. The light emitting chip 10, the reflecting cup 20 and the package 30 are consistent features among the structures of the first exemplary embodiment. The difference in the fourth exemplary embodiment is that the light emitting device 400 further includes a wavelength conversion layer 40 covering the first light emitting surface 12 and the second light emitting surface 13 the light emitting chip 10.

The wavelength conversion layer 40 is for converting the light emitted from the light emitting wafer 10 into a specific wavelength. It will be appreciated that the wavelength conversion layer 40 may adjust the light wavelength in accordance with a desire of a user.

It is to be understood that, in another embodiment, the reflective cup 20 may apply to the inclined surface 214 according to the second embodiment.

Figure 7:
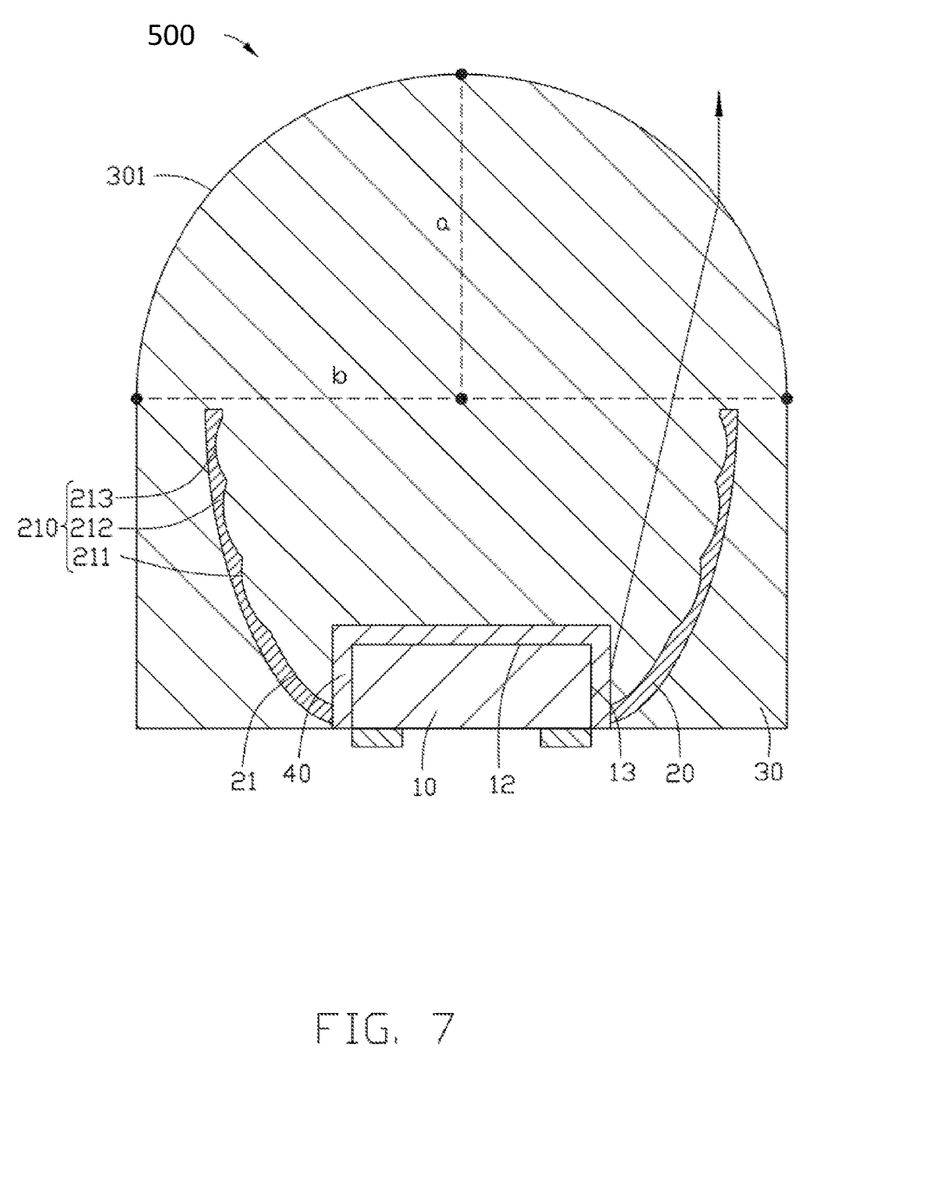
FIG. 7 is a schematic view of a fifth exemplary embodiment of the light emitting device according to the present disclosure.

As shown in FIG. 7, in a fifth embodiment, the light emitting device 500 includes a light emitting chip 10, a reflecting cup 20, a package 30, and a wavelength conversion 40. The light emitting chip 10, the reflecting cup 20, the package 30, and the wavelength conversion 40 are consistent features among the structures of the fourth exemplary embodiment. The difference in the fifth exemplary embodiment is that the light exiting surface 301 of the package 30 is the semi-circular surface.

A bottom end of the semi-circular surface is flush with the top end of the reflecting cup 20. A height from an apex of the light exiting surface 301 to the bottom end of the semi-circular surface 301 represents a, and a width of the bottom end of the light exiting surface 301 represents b, and wherein a value of b/a is in a range of about $1.4 \leq b/a \leq 2$.

In the embodiment, the value of b/a is about 2.

It should be noted that, in another embodiment, the reflecting cup 20 may change according to the second exemplary embodiment. The wavelength conversion layer 40 may change according to the third embodiment, the forth embodiment, or a combination thereof.

Figure 8:
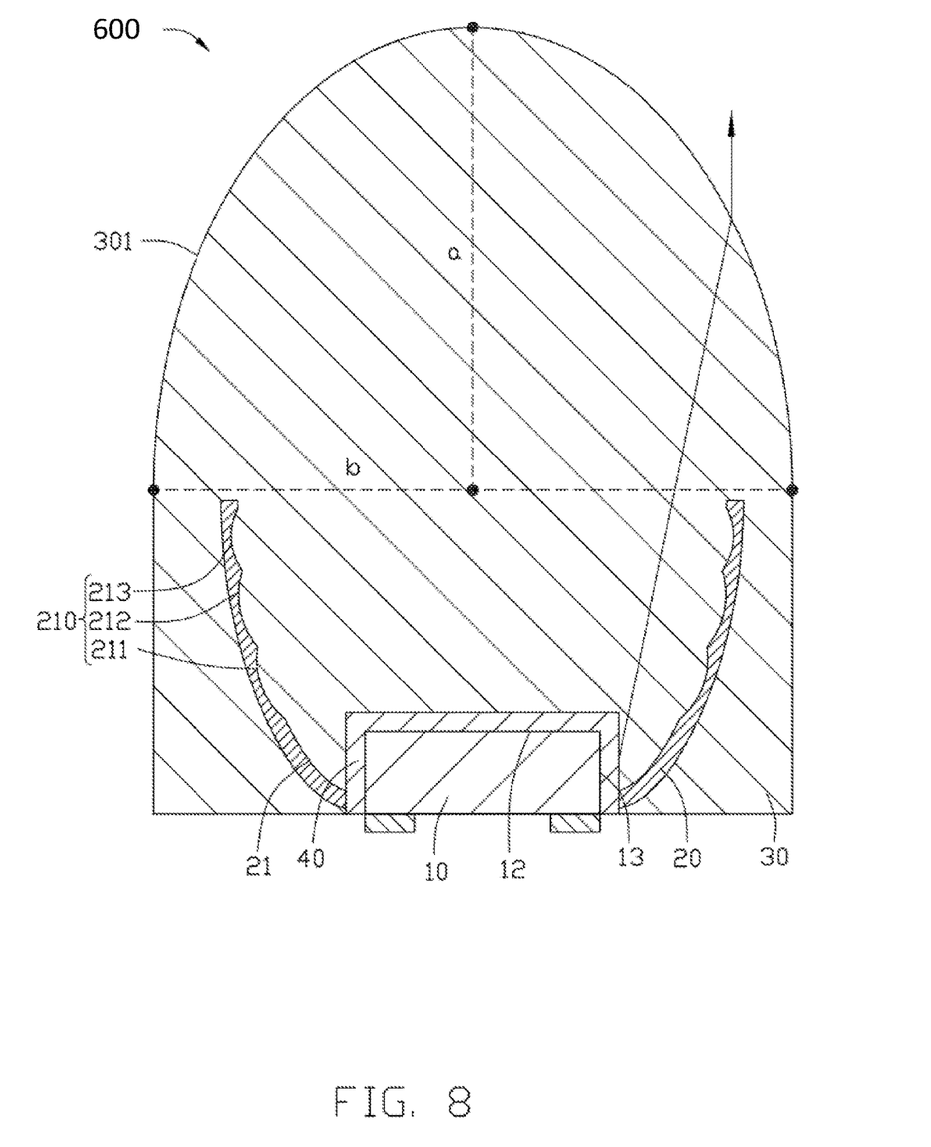
FIG. 8 is a schematic view of a sixth exemplary embodiment of the light emitting device according to the present disclosure.

As shown in FIG. 8, in a sixth embodiment, the light emitting device 600 includes a light emitting chip 10, a reflecting cup 20, a package 30, and a wavelength conversion 40. The light emitting chip 10, the reflecting cup 20, the package 30, and the wavelength conversion 40 are consistent features among the structures of the fourth exemplary embodiment. The difference in the sixth exemplary embodiment is that the light exiting surface 301 of the package 30 is the elliptical surface.

A bottom end of the elliptical surface is flush with the top end of the reflecting cup 20. A height from an apex of the elliptical surface to the bottom end of the elliptical surface represents a, and a width of the bottom end of the elliptical surface represents b, and wherein a value of b/a is in a range of about $1.4 \leq b/a < 2$.

It should be noted that, in another embodiment, the reflecting cup 20 may change according to the second exemplary embodiment. The wavelength conversion layer 40 may change according to the third embodiment, the forth embodiment, or a combination thereof.

Figure 9:
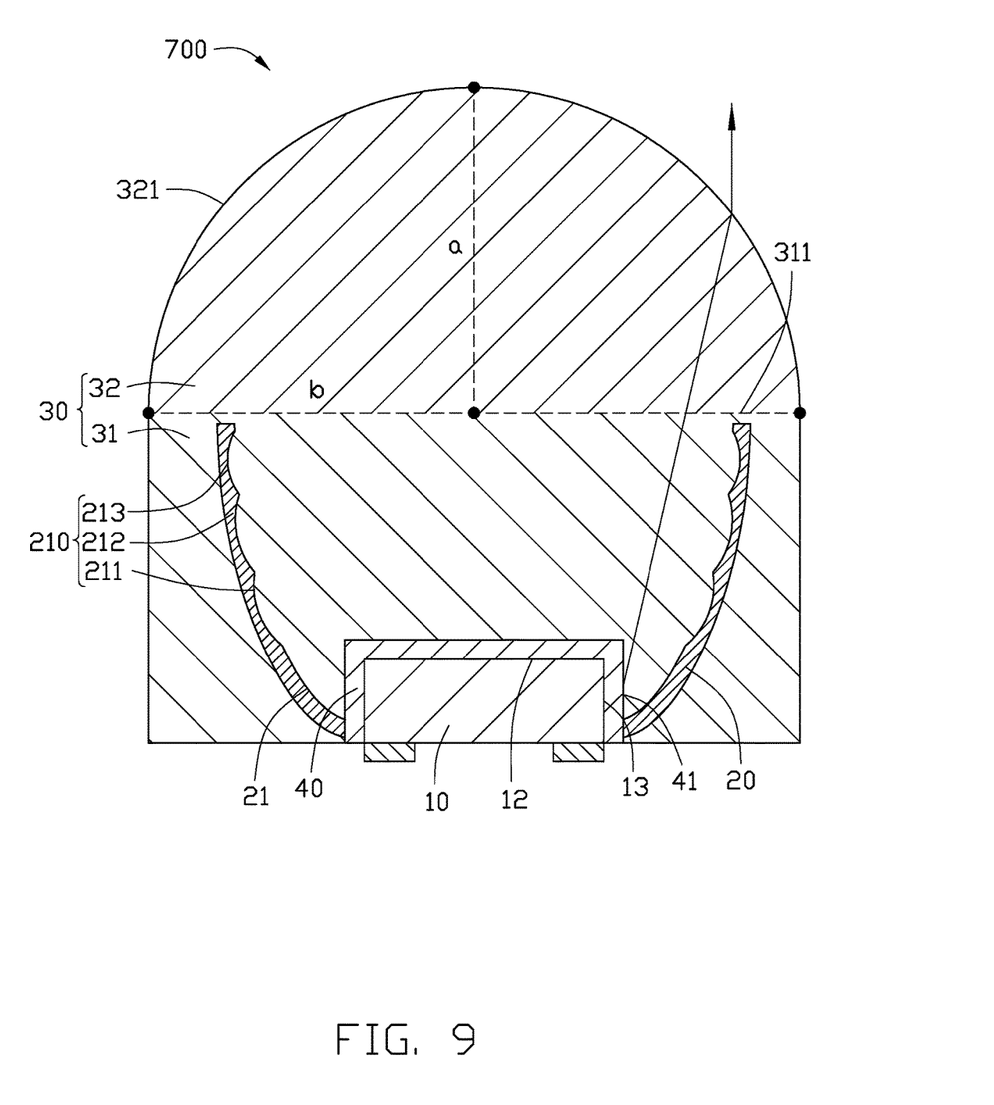
FIG. 9 is a schematic view of a seventh exemplary embodiment of the light emitting device according to the present disclosure.

As shown in FIG. 9, in a seventh embodiment, the light emitting device 700 includes a light emitting chip 10, a reflecting cup 20 and a package 30. The light emitting chip 10, the reflecting cup 20 and the package 30 are consistent features among the structures of the first exemplary embodiment. The difference in the seventh exemplary embodiment is that the package 30 includes a first light guiding member 31 and a second light guiding member 32 arranged over the first light guiding member 31.

The first light guiding member 31 includes a first light exiting surface 311. The first light exiting surface 311 may be, but is not limited to, a planar surface.

The second light guiding member 32 includes a second light exiting surface 321 coupled to the second light exiting surface 321. The second light exiting surface 321 may be, but is not limited to, an elliptical or semi-circular surface.

The first light exiting surface is flush with the top end of the reflecting cup 20. A height from an apex of the second light exiting surface 321 to the first light exiting surface 311 represents a, and a width of the first light exiting surface 311 represents b, and wherein a value of b/a is in a range of about $1.4 \leq b/a \leq 2$.

It should be noted that, in the embodiment, the light emitting chip 10 may change according to the first exemplary embodiment in the above modes or a combination thereof.

Figure 10:
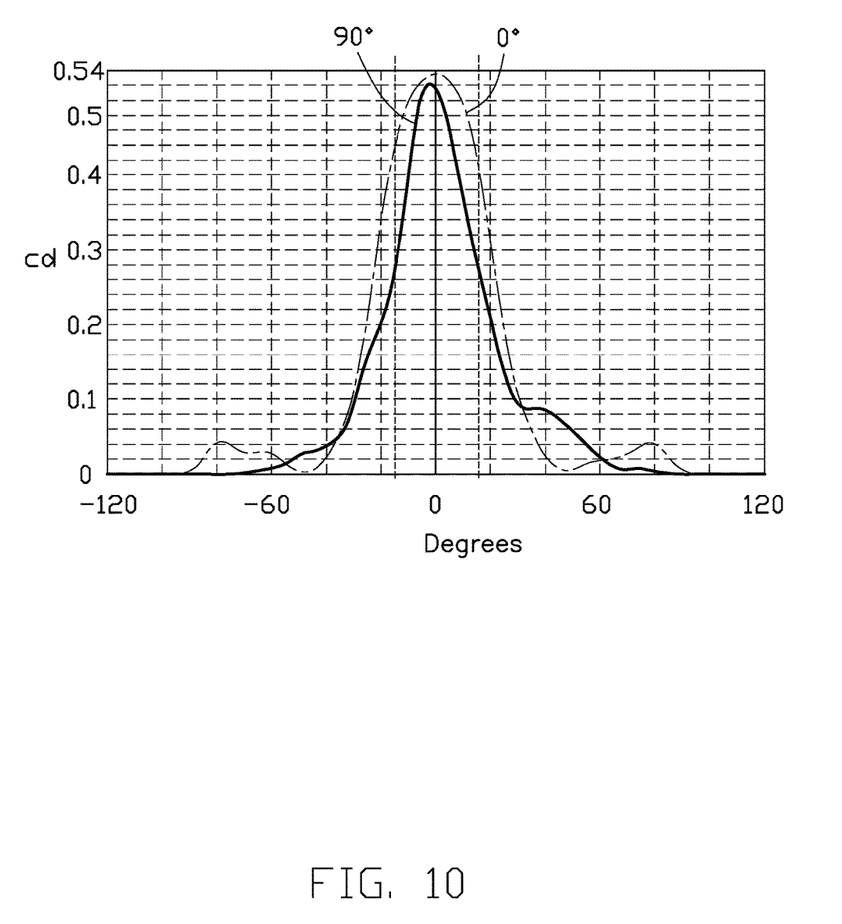
FIG. 10 is a graph of a measured light exiting angle of the light emitting device of the first exemplary embodiment.

FIG. 10 shows the assay results of the light emitting angles of the light emitted by the light emitting device 100 according to the first embodiment of the present invention. The experiment is divided into Groups 1 and 2, wherein the measured angle of the light emitting device 100 is at 0 degree in Group 1, and the measured angle of the light emitting device 100 is at 90 degree in Group 2. The measured angle is defined as a tester measuring the light emitting angle of the light emitting device 100 at a relative position. Specifically, the 0 degree represents the tester selected one position of the second light emitting surface of the light emitting chip (represent here as: a first simulation test position), the 90 degrees represents a second simulation test position relative to the first simulation test position rotated 90 degrees. It can be seen from Group 1 and the Group 2 that the light emitting angle of the light emitted by the light emitting device 100 is less than about 20 degrees. The result here shows that the light emitted by the light emitting device 100 is more concentrated because the light emitting angle of the light emitting device 100 is reduced, so the light emitted by the light emitting device 100 can be irradiated to a longer distance. Further, the light emitting device may be applied to a high beam lamp.

The exemplary embodiments illustrated and described above are only examples. Many details are often found in the art such as the other features of a light emitting device. Therefore, many such details are neither illustrated nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A light emitting device comprising:
   a light emitting chip, wherein the light emitting chip comprises a first light emitting surface and a second light emitting surface coupled to the first light emitting surface;
   a reflecting cup, arranged around a periphery of a side surface of the second light emitting surface; and
   a package, encapsulating the light emitting chip and the reflecting cup,
   wherein the reflecting cup comprises an inner surface facing the second light emitting surface of the light emitting chip, the inner surface of the reflector cup comprises a multifocal paraboloid, the multifocal paraboloid comprises multistage paraboloids, each paraboloid has at least one corresponding focus, and the corresponding focus points of the multistage paraboloids are symmetrically distributed on the first light emitting surface of the light emitting chip.

2. The light emitting device of claim 1, wherein the light emitting device further comprises a wavelength conversion layer arranged over the light emitting chip.

3. The light emitting device of claim 2, wherein the wavelength conversion layer arranges on an end portion of the reflecting cup opposite to the light emitting chip.

4. The light emitting device of claim 2, wherein the wavelength conversion layer covers the first light emitting surface and the second light emitting surface of the light emitting chip.

5. The light emitting device of claim 1, wherein the reflecting cup is made of a specular reflective material.

6. The light emitting device of claim 5, wherein the specular reflective material is a metallic material, and wherein the metallic material comprises gold, silver, aluminum, chromium, copper, tin, or nickel.

7. The light emitting device of claim 1, wherein each paraboloid has at least one focal length, and wherein the corresponding focal length of the multistage paraboloids increases gradually in a direction away from the light emitting chip.

8. The light emitting device of claim 1, wherein the first light emitting surface is an axisymmetric pattern.

9. The light emitting device of claim 1, wherein the first light emitting surface comprises a symmetry axis, and each paraboloid has at least one focus point, and wherein the corresponding focus points of the multistage paraboloids are symmetrical around the central axis of the light emitting chip and spaced apart from each other, and arrange on the symmetry axis of the first light emitting surface.

10. The light emitting device of claim 1, wherein the adjacent two paraboloids are symmetrical.

11. The light emitting device of claim 1, wherein the multistage paraboloids comprise at least three-stage parabolas, the at least three-stage paraboloids comprises a first paraboloid, a second paraboloid and a third paraboloid, and the first paraboloid, the second paraboloid and the third paraboloid arrange away from a direction of the light emitting chip in a smooth transition.

12. The light emitting device of claim 1, wherein a focus of the first paraboloid is located at a position adjacent to a bottom portion of the light emitting chip, a focus of the third paraboloid is located at a position adjacent to a top portion of the wavelength conversion layer, and a focal point of the second paraboloid is located between the focal point of the first paraboloid and the focal point of the third paraboloid.

13. The light emitting device of claim 1, wherein the inner surface of the reflecting cup arranges an inclined surface coupled to the multistage paraboloids adjacent to the light emitting chip.

14. The light emitting device of claim 13, wherein the inclined surface of the reflecting cup and the second light emitting surface form an angle, and wherein the angle is substantially in a range of 30 degrees to 45 degrees.

15. The light emitting device of claim 1, wherein the package comprises a light exiting surface facing the first light emitting surface of the light emitting chip.

16. The light emitting device of claim 1, wherein the light exiting surface is substantially a planar, an elliptical or semi-circular surface.

17. The light emitting device of claim 1, wherein a ratio of a luminous intensity of the first light emitting surface of the light emitting chip to the luminous intensity of the second light emitting surface of the light emitting chip is substantially in the range of 1:1.

18. The light emitting device of claim 1, wherein the package comprises a first light guiding member and a second light guiding member formed on the first light guiding member, and wherein the first light guiding member encapsulates the light emitting chip and the reflecting cup.

19. The light emitting device of claim 18, wherein the first light guiding member comprises a first light exiting surface, the first light exiting surface is a planar surface, and wherein the second guiding member comprises a second light exiting surface, the second light exiting surface is an elliptical or semi-circular surface.

20. The light emitting device of claim 19, wherein a height from an apex of the first light exiting surface to the second light exiting surface represents a, and a width of the first light exiting surface represents b, and wherein a value of b/a is in a range of $1.4 \leq b/a \leq 2$.

* * * * *